(12) United States Patent
Moriyama et al.

(10) Patent No.: US 6,478,977 B1
(45) Date of Patent: Nov. 12, 2002

(54) POLISHING METHOD AND APPARATUS

(75) Inventors: Shigeo Moriyama, Tama (JP);
Katsuhiko Yamaguchi, Hachioji (JP);
Yoshio Homma, Nishitama-gun (JP);
Sunao Matsubara, Tokorazawa (JP);
Yoshihiro Ishida, Hitachinaka (JP);
Ryousei Kawa-ai, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/500,238

(22) Filed: Feb. 8, 2000

Related U.S. Application Data

(63) Continuation of application No. 09/029,903, filed as application No. PCT/JP95/01814 on Sep. 13, 1995, now Pat. No. 6,180,020.

(51) Int. Cl.$^7$ .............................................. C01B 33/00
(52) U.S. Cl. .......................................... 216/52; 438/692
(58) Field of Search ................................ 438/692, 693, 438/691; 216/52; 156/345

(56) References Cited

U.S. PATENT DOCUMENTS

| | | | |
|---|---|---|---|
| 3,918,220 A | * 11/1975 | Jury et al. ..................... | 451/59 |
| 4,193,226 A | 3/1980 | Gill, Jr. et al. | |
| 4,459,779 A | 7/1984 | Shen | |
| 4,654,051 A | 3/1987 | Orita et al. | |
| 4,750,915 A | 6/1988 | Tomita et al. | |
| 4,944,836 A | 7/1990 | Beyer et al. | |
| 5,273,558 A | 12/1993 | Nelson et al. | |
| 5,361,545 A | 11/1994 | Nakamura | |
| 5,500,558 A | 3/1996 | Hayashide | |
| 5,522,965 A | 6/1996 | Chisholm et al. | |
| 5,605,499 A | * 2/1997 | Sugiyama et al. .......... | 451/443 |
| 5,689,130 A | * 11/1997 | Okabe et al. ................ | 257/342 |
| 5,791,330 A | * 8/1998 | Tselesin ....................... | 125/15 |
| 5,827,395 A | 10/1998 | Masumura | |
| 5,844,274 A | 12/1998 | Tsutsumi | |
| 5,855,998 A | * 1/1999 | Tanabe et al. ............... | 428/216 |
| 6,309,800 B1 | * 10/2001 | Okamoto ..................... | 430/311 |

FOREIGN PATENT DOCUMENTS

| | | |
|---|---|---|
| CN | 1065279 A | 10/1992 |
| EP | 0 272 531 | 6/1988 |
| JP | 63-150162 | 6/1988 |
| JP | 63-174855 | 7/1988 |
| JP | 1-42823 | 2/1989 |
| JP | 2-267950 | 11/1990 |
| JP | 5-285847 | 11/1993 |
| JP | 6-208980 | 7/1994 |
| JP | 6-302568 | 10/1994 |

OTHER PUBLICATIONS

Proceedings of the 1st International ABTEC Conference, Seoul Korea, Nov. 1993, pp. 80–85.
Abstract of JP 01–042823, Patent Abstracts of Japan, vol. 013, No. 240.

* cited by examiner

*Primary Examiner*—Gregory Mills
*Assistant Examiner*—Sylvia R MacArthur
(74) *Attorney, Agent, or Firm*—Mattingly, Stanger & Malur, P.C.

(57) ABSTRACT

The present invention relates to a polishing method using a grindstone comprising abrasive grains and a bonding resin for bonding the abrasive grains, as well as to a polishing apparatus to be used for the polishing method. By using a resin for bonding abrasive grains, it is possible to obtain a grindstone having a desired modulus of elasticity. With such a grindstone, the surface of a substrate having concave and convex portions can be rendered uniformly flat, irrespective of the size of the concave and convex portions. Further, by first polishing the substrate surface with a polishing tool of a small elastic modulus and thereafter polishing it with a polishing tool of a large elastic modulus, it is possible to obtain a polished surface of reduced damage. The method of the invention is effective in planarizing various substrate surfaces having concave and convex portions.

12 Claims, 11 Drawing Sheets

(a)

(b)

POLISHING METHOD AND APPARATUS

This is a continuation application of U.S. Ser. No. 09/029,903, filed Mar. 12, 1998 which is based on PCT/JP95/01814 filed Sep. 13, 1995, now U.S. Pat. No. 6,180,020.

TECHNICAL FIELD

The present invention relates to a technique for planarizing a substrate surface pattern by polishing. In particularly, the invention is concerned with a polishing method for use in the process for fabricating a semiconductor integrated circuit, as well as a polishing apparatus to be used in the polishing method.

BACKGROUND ART

The semiconductor manufacturing process comprises many processes. Description will be directed first to a wiring process as an example of a process to which the invention is applied, with reference to FIGS. 1(a) to 1(f).

FIG. 1(a) is a sectional view of a wafer with a first layer of wiring formed thereon. On the surface of a wafer substrate 1 with a transistor portion formed thereon is formed an insulating film 2, on which is further formed a wiring layer 3 such as aluminum for example. For junction with the transistor, contact holes are formed in the insulating film 2 and therefore the portions, indicated at 3', of the wiring layer corresponding to the contact holes are somewhat depressed. In a second-layer wiring process shown in FIG. 1(b), an insulating film 4 and a metal aluminum layer 5 are formed on the first layer, further, a photoresist film 6 for exposure to make the aluminum layer into a wiring pattern is applied onto the aluminum layer. Next, as shown in FIG. 1(c), a wiring circuit pattern of the second layer is transferred by exposure onto the photoresist film 6 with use of a stepper 7. In this case, if the surface of the photoresist film 6 is concavo-convex, the concave and convex portions, for example the concave portion indicated at 8, on the surface of the photoresist film are not simultaneously in focus, thus resulting in unsatisfactory resolution, which is a serious problem.

For eliminating the above-mentioned inconvenience, the following planarizing process for the substrate surface has been studied. Following the step shown in FIG. 1(a), polishing is applied, after the formation of the insulating layer 4, as shown in FIG. 1(d), by a method as described later so that the layer 4 becomes flat to the level of 9 in the same figure. In this way the state of FIG. 1(e) is obtained. Thereafter, a metal aluminum layer 5 and a photoresist layer 6 are formed, followed by exposure using the stepper 7 as in FIG. 1(f). In this state the foregoing problem of unsatisfactory resolution does not occur.

In FIG. 2 there is illustrated a chemical mechanical polishing method which has heretofore been commonly adopted for planarizing the aforesaid insulating film pattern. A polishing pad 11 is stuck on a surface table 12 and is allowed to rotate. As the polishing pad 11 there is used, for example, a pad obtained by slicing and molding a foamed urethane resin into a thin sheet. A suitable material and fine surface structure are selected from among various materials and fine surface structures according to the type of workpiece and the degree of surface roughness to be attained finally. The wafer 1 to be processed is fixed to a wafer holder 14 through an elastic pressing pad 13. While the wafer holder 14 is rotated, it is pressed against the surface of the polishing pad 11, and a polishing slurry 15 is fed onto the polishing pad, whereby the convex portions of the insulating film 4 on the wafer surface are polished off, thus affording a flat surface.

In the case of polishing such an insulating film as a silicon dioxide film, there usually is employed colloidal silica as the polishing slurry. Colloidal silica is in the form of a suspension of fine silica particles 30 nm or so in diameter in an aqueous alkali solution such as a potassium hydroxide solution. Because of an additional chemical action in the presence of alkali, the use of such colloidal silica is characterized in that an extremely high processing efficiency and a smooth surface with reduced processing damage are obtained in comparison with a mechanical polishing an abrasive alone. This method thus involving the supply of polishing slurry between the polishing pad and the workpiece during processing is well known as a free abrasive polishing technique.

The conventional wafer planarizing technique using such a free abrasive polishing method involves two problems that are difficult to be solved when classified broadly. One problem is a pattern size dependence problem such that in a certain type of pattern or a certain state of difference in height, it is impossible to attain planarization to a satisfactory extent. The other problem is an excessively high cost of consumption articles required in the polishing process. These problems will be described below in more detail.

Generally, on a semiconductor wafer are formed patterns having various sizes and differences in height. For example, in the case of a semiconductor memory device, as shown in FIG. 3(a), one chip is divided broadly into four blocks called memory mat portions 16, and in the interior of each block are formed fine memory cells regularly and densely. Along the boundaries of four memory mat portions is formed a peripheral circuit 17 for making access to the above memory cells. In the case of a typical dynamic memory, one chip size is about 7 mm×20 mm, and the width of the peripheral circuit 17 is 1 mm or so. In the section of the chip taken on line A–A', as shown in FIG. 3(b), an average height of a memory mat portion 16H is about 0.5 to 1 μm higher than that of a peripheral circuit portion 17L. If an insulating film 4 of about 1 to 2 μm thick is formed on such a stepped pattern, a sectional shape 31 of the surface portion substantially reflects the stepped shape of the base pattern.

In the planarization process contemplated in the present invention, the insulating film 4 on the wafer surface is to be rendered flat, as indicated by a dot-dashline 32. However, in the case of using a soft polishing pad formed of a polyurethane foam often used for the purpose being considered, the planarization intended as above is not attained because the polishing speed involves pattern dependence. More specifically, as shown in FIG. 4, if a soft polishing pad 11L is used, the surface of the polishing pad is deformed, as indicated by a solid line 30 in the FIG. 1 due to the polishing load. A fine pattern with a size of the order of micron is polished flat in a short time because of concentration of load, but in the case of a large pattern with a size of the order of millimeter, the polishing speed is low because the load applied thereto is in the form of a distributed load. As a result, the sectional shape after polishing becomes like that indicated by a broken line 34 in the figure, there still remaining a difference in height,d.

Flatness can be improved by making the polishing pad harder, but in this case there arises a new problem of increased unevenness in processing within the wafer plane as well as a problem of processing damage as described later. As to the cause of such an increase of processing unevenness which occurs in the use of a hard pad, it has not been made clear yet scientifically. But it is presumed that the probability of abrasive fed onto the polishing pad surface being captured by fine structural portions on the pad surface and entering between the pad and the substrate to be processed varies, and that this variation exerts an influence on the processing. For the semiconductor wiring process it is required that such unevenness be ±5% or less. At present, an upper limit of the polishing pad hardness is about 10 kg/mm$^2$ in terms of Young's modulus. Therefore, in a semiconductor device wherein a variety of patterns, including small and large patterns, of the order of millimeter to the order of micron are mixed together, like a memory device, it is impossible to expect a satisfactory effect of planarization. For this reason, the products to which such a polishing pad can be applied are limited to semiconductor products not containing a very large pattern, for example a logic LSI.

As a polishing pad having a characteristic intermediate between hard and soft polishing pads, a polishing pad comprising a soft pad and hard polishing pellets embedded in part of the soft pad is disclosed in Japanese Patent Laid Open No. Hei 6-208980. However, the polishing characteristic obtained is almost the same as that of a polishing pad having an intermediate hardness.

The second subject to be attained by the planarization technique for a semiconductor wafer based on the above conventional free abrasive polishing method is the reduction of running cost which is high. This is attributable to a low utilization efficiency of polishing slurry used in the free abrasive polishing method. More particularly, for ultra-smooth polishing not causing polishing flaws, it is necessary that a polishing slurry, for example colloidal silica, be fed at a rate of several hundred cc/min or more. However, the greater part of the slurry is wasted without contributing to the actual processing. The cost of a high purity slurry for semiconductor manufacture is extremely high, and the cost of the planarizing polishing process is mostly dependent on the polishing slurry. Thus, it has been keenly desired to make an improvement on this point.

As a prior art method other than those referred to above, a bonded abrasive processing method, using a grindstone for high-speed rotation is fabricated by binding an abrasive with a metallic powder or a resin, is described on pages 80 to 85 of Proceedings in the 1st International ABTEC Conference (Seoul, November 1993). However, this method is known to involve the drawback that there often occur fine scratches on the processed surface. Further, for solving this problem of scratching, a planarization technique using a fine abrasive grindstone with an extremely small grain diameter fabricated by electrophoresis is disclosed in Japanese Patent Laid Open No. hei 6-302568. According to this technique, however, since the grindstone itself is hard, there still remains the problem of scratching caused by dust or the like contained in the polishing fluid used or in the processing atmosphere.

In the conventional semiconductor wafer planarizing technique using the free abrasive polishing method, as explained above, there exists no condition that permits simultaneous planarization for both a fine pattern of the order of micron in minimum size and a large pattern of the order of millimeter. Thus, it has so far been difficult to apply this conventional technique to the manufacture of a semiconductor integrated circuit including a variety of large and small patterns, like memory LSI. Further, a high running cost required for the polishing process has been a great drawback in its application to mass production.

It is an object of the present invention to overcome the above-mentioned drawbacks of the prior art and provide a processing method for planarizing both large and fine pattern portions into a single plane without causing any processing damage, as well as an apparatus for the processing method.

It is another object of the present invention to provide a processing method that is low in running cost and an apparatus for the processing method.

DISCLOSURE OF INVENTION

The above objects of the present invention can be achieved by adopting a fixed abrasive processing method using a polishing tool (e.g. grindstone) which has a controlled modulus of elasticity, in place of the conventional free abrasive polishing process using a polishing pad and a polishing slurry.

Further, the problem of processing damage to ultra-fine patterns which is apt to occur in the use of a hard polishing tool can be solved, not by planarizing all the patterns by a single processing as in the prior art, but by first planarizing only such fine patterns as are apt to be damaged, using a soft polishing tool, and thereafter planarizing large patterns in a highly efficient manner with a large processing force using a hard polishing tool such as a hard grindstone or polishing pad.

Since the fixed abrasive processing method of the present invention uses a certain type of grindstone and processing conditions selected most suitably in conformity with the physical properties of a workpiece, even if the polishing tool used is hard, it is possible to effect a planarizing process with little pattern dependence and little unevenness in the processing speed in the substrate plane, without causing unevenness in processing. Besides, an extremely low running cost can be realized because an expensive polishing slurry is not needed. Moreover, washing after the processing becomes easier.

Further, if corner portions of ultra-fine patterns which are apt to undergo processing damage and those of large-sized patterns which are apt to be dropped out are polished, cut and rounded beforehand with a soft polishing pad of a low rigidity and are thereafter planarized with a hard polishing pad having a high shape creating function, it is possible to obtain a satisfactory processed surface with reduced pattern width dependence, and which is free of processing damage.

Although the semiconductor wafer has been referred to above as an object to which the present invention is applied, the invention is also applicable to the planarization of thin film display devices and glass and ceramic substrates.

BRIEF DESCRIPTION OF DRAWINGS

FIG. 3(*b*) is a sectional view thereof;

FIG. 7(*a*) is a diagram for explaining polishing conditions in the prior art and FIG. 7(b) is a diagram for explaining polishing conditions in the present invention;

BEST MODE FOR CARRYING OUT THE INVENTION

Figure 1:
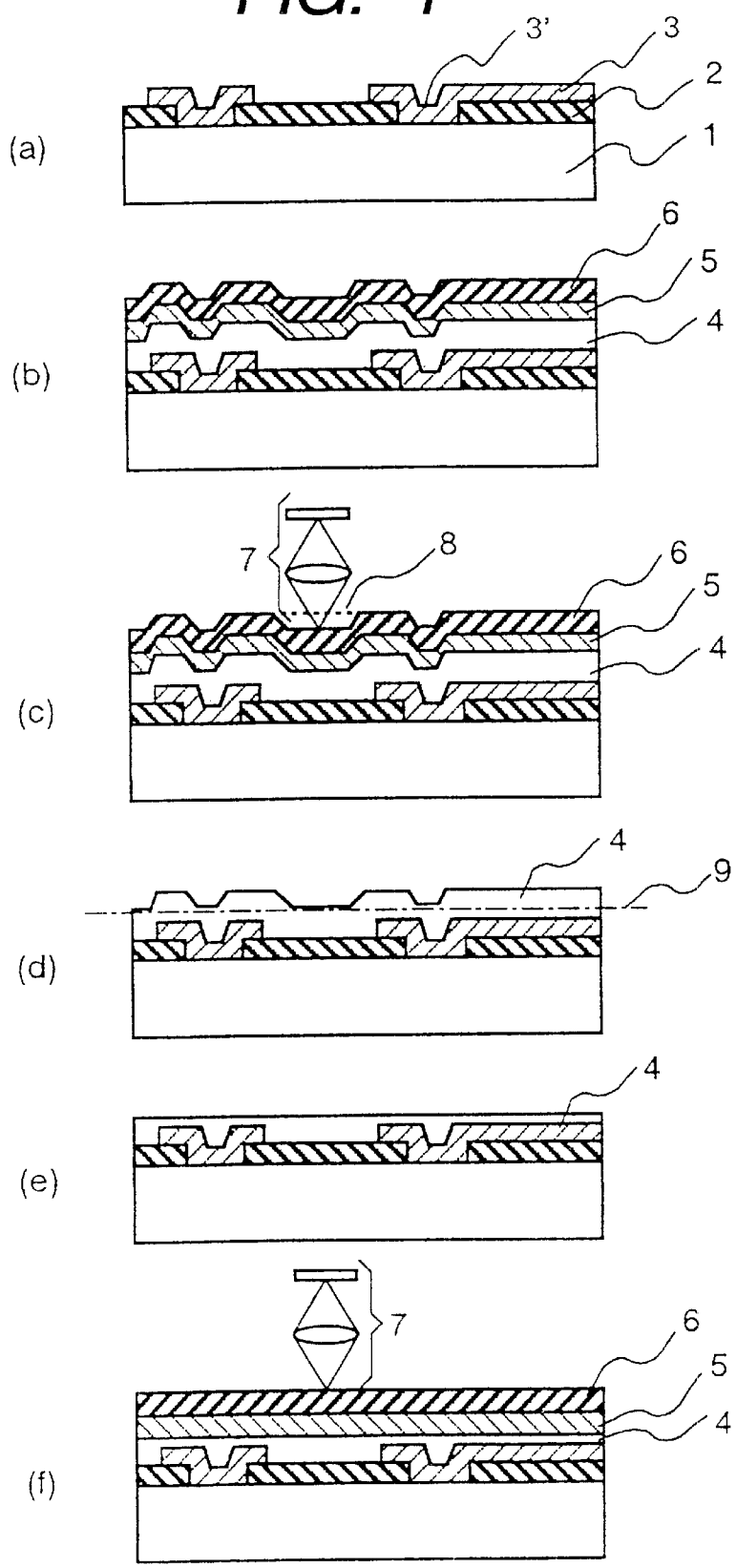
FIGS. 1(*a*) to 1(*f*) are explanatory diagrams of a process for planarizing the surface of wafer.
Figure 2:
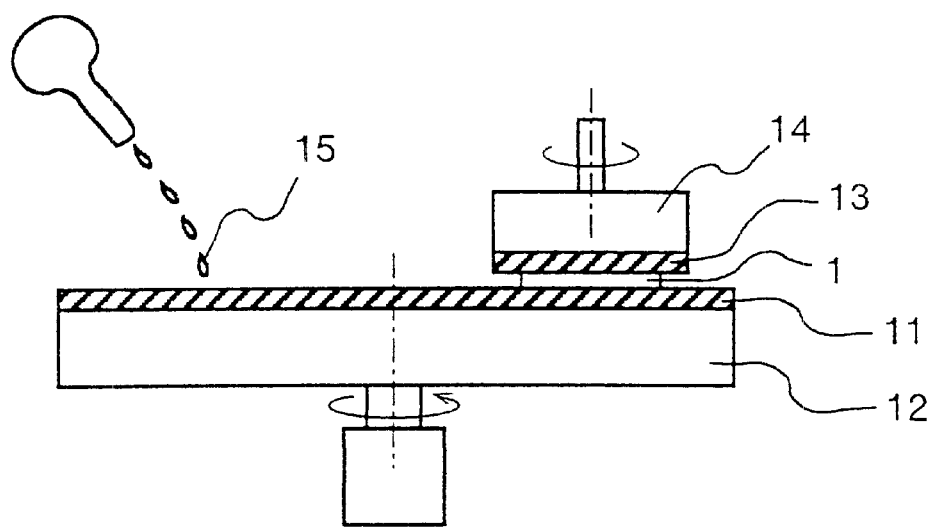
FIG. 2 is a diagram explaining a chemical mechanical polishing method.
Figure 3:
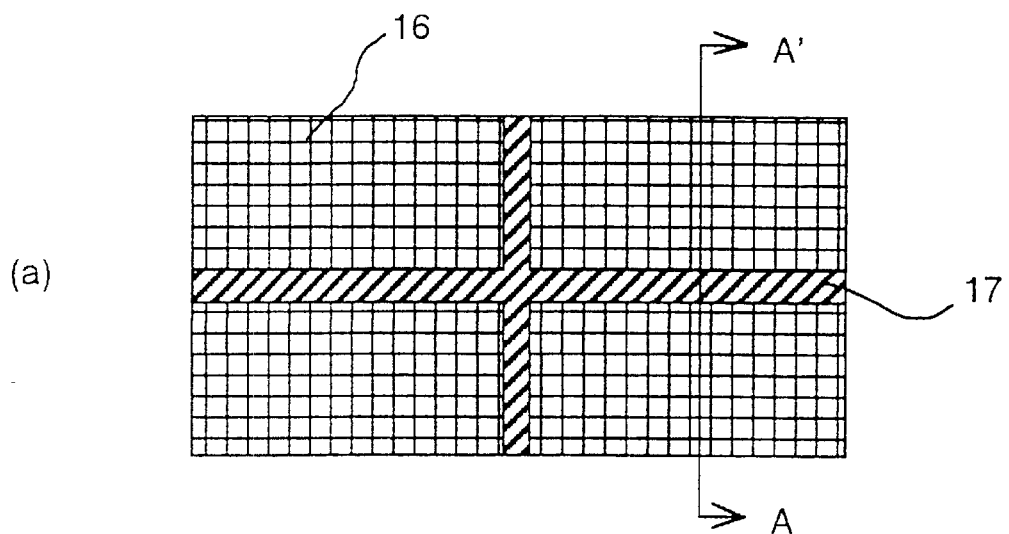
FIG. 3(*a*) is a plan view of a semiconductor memory device.
Figure 3:
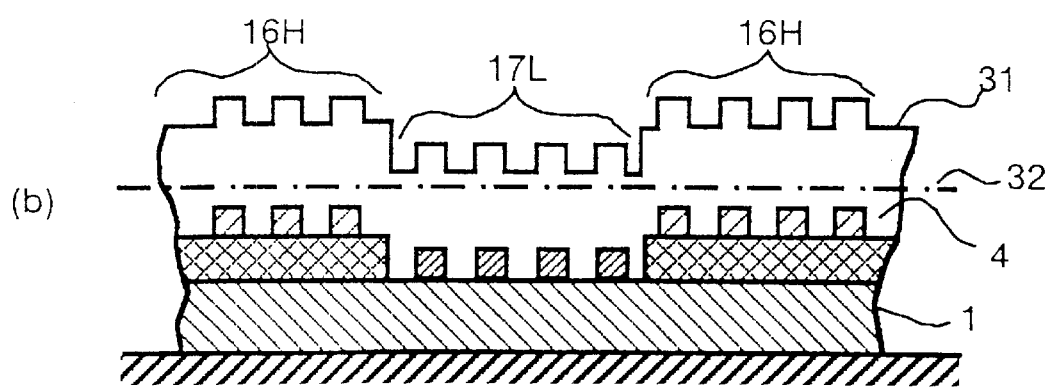
Figure 4:
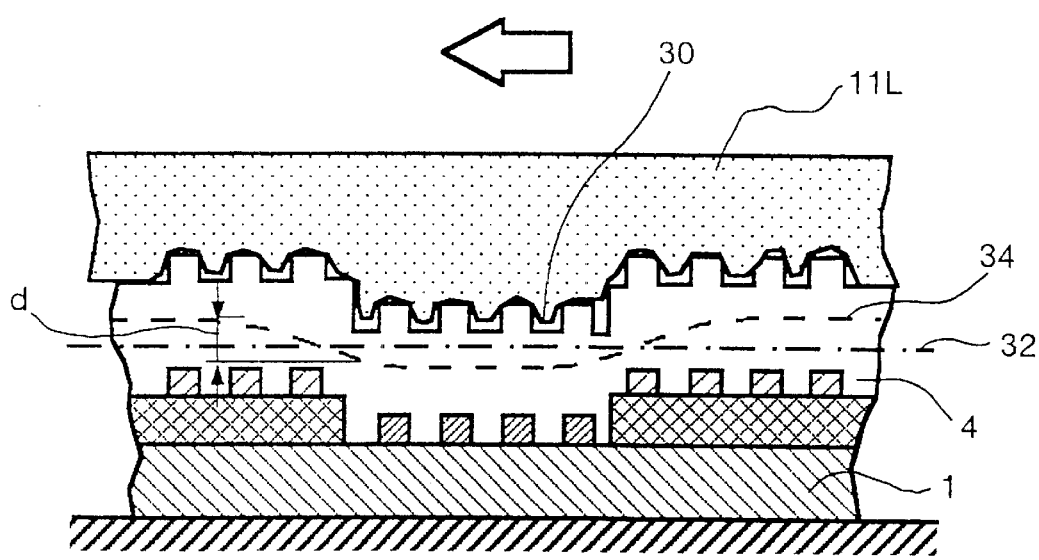
FIG. 4 is a diagram explaining a problem involved in a polishing method using a soft polishing pad.

An embodiment of the present invention will now be described in detail. The present invention is characterized in that a special grindstone having an optimally controlled hardness is used in place of the conventional polishing pad in the apparatus shown in FIG. 2. As explained previously in connection with the prior art, there are known several techniques for planarizing the surface of a semiconductor wafer with use of a grindstone of fine grains. But all of those techniques involve a drawback that fine scratches are often developed in the processed surface. Thus, they are not at a stage of practical application yet.

It has so far been considered that the occurrence of such scratching is attributable mainly to a too-large size of grains. Having made studies, however, the present inventors found out that it is ascribable to a too-large elastic modulus of the grindstone used rather than the size of grains.

Figure 5:
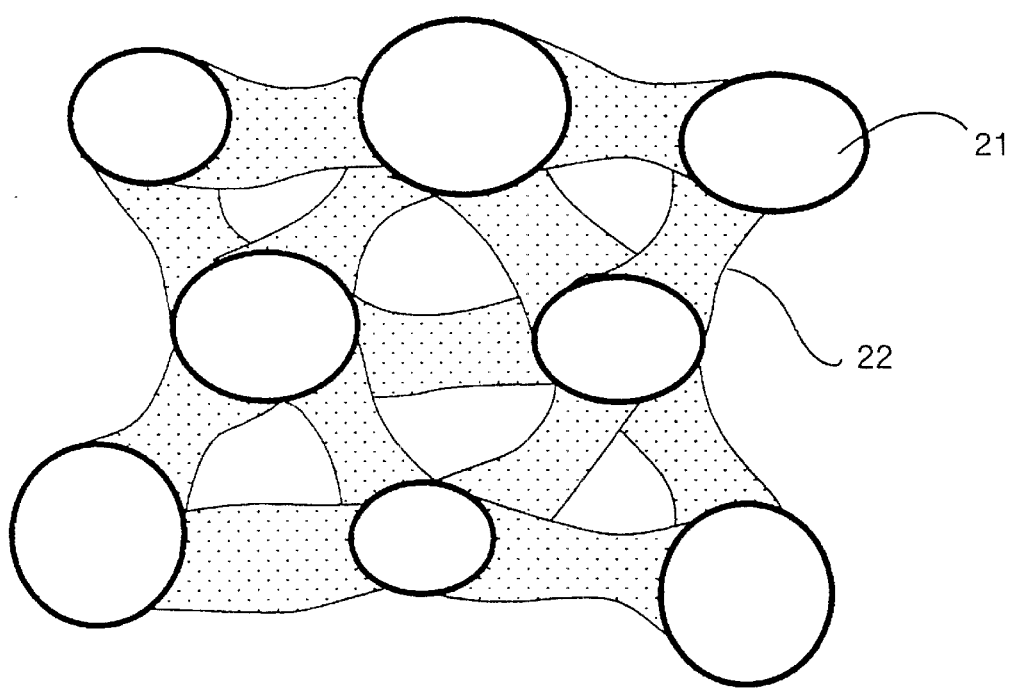
FIG. 5 is a diagram explaining the construction of grindstone used in the present invention.

The present invention is characterized by using, instead of the aforesaid dense and hard grindstone, an extremely soft grindstone wherein grains 21 are loosely bonded with a soft resin 22 as shown in FIG. 5. To be more specific, the grindstone has an elastic modulus of 5 to 500 kg/mm$^2$, and thus the hardness thereof is one-tenth to one-hundredth of that of conventional grindstones. Conversely, it is five to fifty times as hard as hard polishing pads, e.g. rigid polyurethane foam, which have heretofore been used in the field to which the invention is applied.

Reference will now be made to an example of a method for fabricating such a soft grindstone. As preferred examples of the grains 21 are mentioned grains of silicon dioxide, cerium oxide and alumina. Grains of 0.01 to 1 μm in diameter can afford a high processing efficiency without scratching. As the resin 22 for bonding the grains, a high-purity organic resin such as a phenolic resin is preferred in the present invention. The grains, after kneading with the bonding resin, are solidified by the application of an appropriate pressure and then, if necessary, subjected to a treatment such as heat-hardening. In this manufacturing method, the hardness of the resulting grindstone can be controlled by suitably selecting the type of bonding resin and the pressure to be applied. In the present invention the hardness of the grindstone used is controlled to a value of 5 to 500 kg/mm$^2$ in terms of an elastic modulus.

Description is now directed to an example of processing which uses a grindstone fabricated in the above manner. When a one micron thick silicon dioxide film was processed using a grindstone which had been obtained by bonding cerium oxide of 1 μm grain diameter with a phenolic resin so as to give an elastic modulus of 100 kg/mm$^2$, there could be obtained a satisfactory processed surface having a surface roughness of 2 nmRa and an extremely good pattern width dependence of 0.3±0.01 μm/min or less in terms of processing speed, with respect to all types of patterns ranging from 10 mm to 0.5 μm. Any unevenness in processing in the wafer surface, which occurs in the use of a hard polishing pad, was not observed. This is presumed to be because the processing according to the present invention uses a bonded abrasive, unlike the conventional processing using a free abrasive.

Although in the above processing example it is only pure water that is supplied as a polishing fluid, an alkaline or acidic fluid may be supplied as in the conventional polishing technique, depending on the type of workpiece. In the case where the workpiece is silicon dioxide or silicon, the use of an alkaline fluid is preferred, while where the workpiece is a metal such as, for example, aluminum or tungsten, an acidic fluid is preferred.

Where a higher grade of surface roughness is required, it is apparent that this requirement can be. satisfied by finishing the workpiece surface using a soft polishing pad after polishing using the aforementioned grindstone.

If the elastic modulus of the grindstone used is outside the foregoing range, it will be impossible to effect processing in a satisfactory manner. In more particular terms, if the elastic modulus of the grindstone used is less than 5 kg/mm$^2$, only such patterns as are small in width will be polished quickly, that is, the pattern width dependence will become marked, resulting in that the memory device cannot be planarized. Conversely, if the elastic modulus of the grindstone used is larger than 500 kg/mm$^2$, the problem of scratching still remains to be solved no matter how small the grain diameter of the grindstone may be. In other words, only in the grindstone elastic modulus range of 5 to 200 kg/mm$^2$ as proposed herein can there be performed a processing suitable for use as a semiconductor. A more preferred range is 50 to 150 kg/mm$^2$.

Even under the above condition for the grindstone used, if an excessive polishing load is imposed on the pattern to be polished with a view to enhancing the processing efficiency, there may occur a problem of processing damage different from the foregoing problem of scratching, depending on the shape of the pattern to be polished. This problem of processing damage will be described below.

Figure 6:
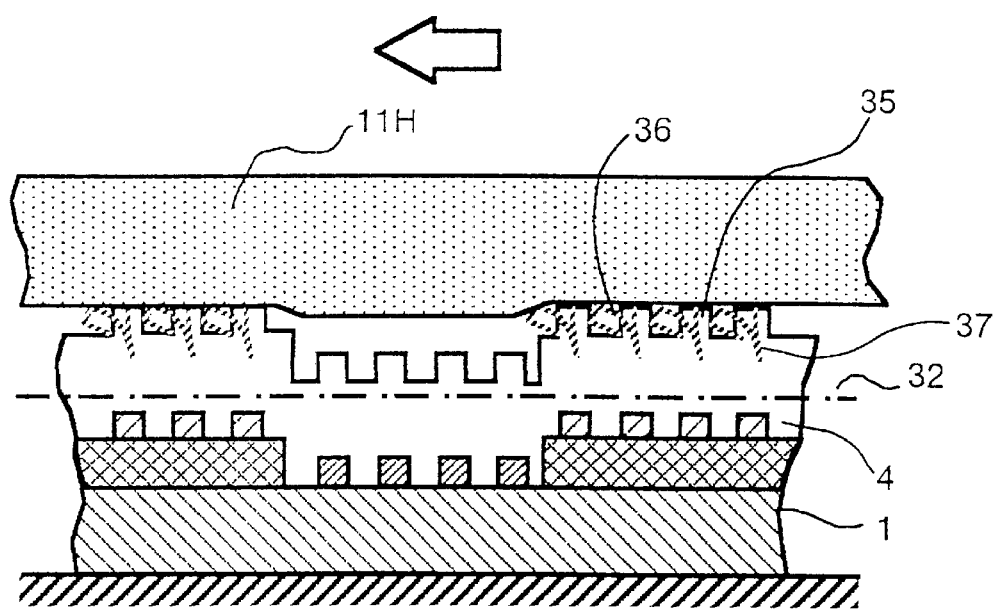
FIG. 6 is a diagram explaining a problem involved in a polishing method using a hard polishing pad.

As shown in FIG. 6, where polishing is performed using a hard grindstone or polishing pad 11H, the surface of the polishing tool will come into contact with only convex portions of a stepped pattern during processing. At this time, if an excessive polishing load is applied to the pattern, end portions 35 of the pattern will undergo a moment induced by a processing friction force and may be peeled off or collapse like dotted lines 36, or fine cracks 37 may be developed at base portions of the pattern. The depth of the crack 37 is often larger than a desired planarization level though different according to processing conditions, which impairs the reliability of the polished product as a semiconductor device. Due to such a damage problem of fine patterns, it has heretofore been required that a planarizing work using a hard polishing tool be carried out slowly at a low load, and for this reason an extremely long processing time has been needed.

The above problem can be solved by the method about to be described. The cause of the aforesaid pattern damage and a basic concept of the present invention for preventing such damage will now be explained with reference to FIG. 7. In the same figure, the two upper diagrams show a state in which convex patterns on a wafer substrate are pushed against a hard polishing pad 11H, while the two lower diagrams show stress distributions applied to the patterns. Just after the start of polishing, end portions of the patterns are still angular, so that stress is concentrated at each end portion of a wide pattern 101, as indicated at 102, and a maximum value thereof reaches ten times or more of an average stress. Also, to a narrow pattern 103 is applied a stress 104 which is close to the said maximum value. In this state, if a relative motion is given between the polishing pad and the wafer substrate, frictional forces proportional to the above stresses are applied to various portions of the patterns. If these frictional forces are larger than the mechanical strength of the pattern material, pattern end portions will be peeled off or a fine pattern will collapse. This is the cause of occurrence of the pattern damage.

Figure 7:
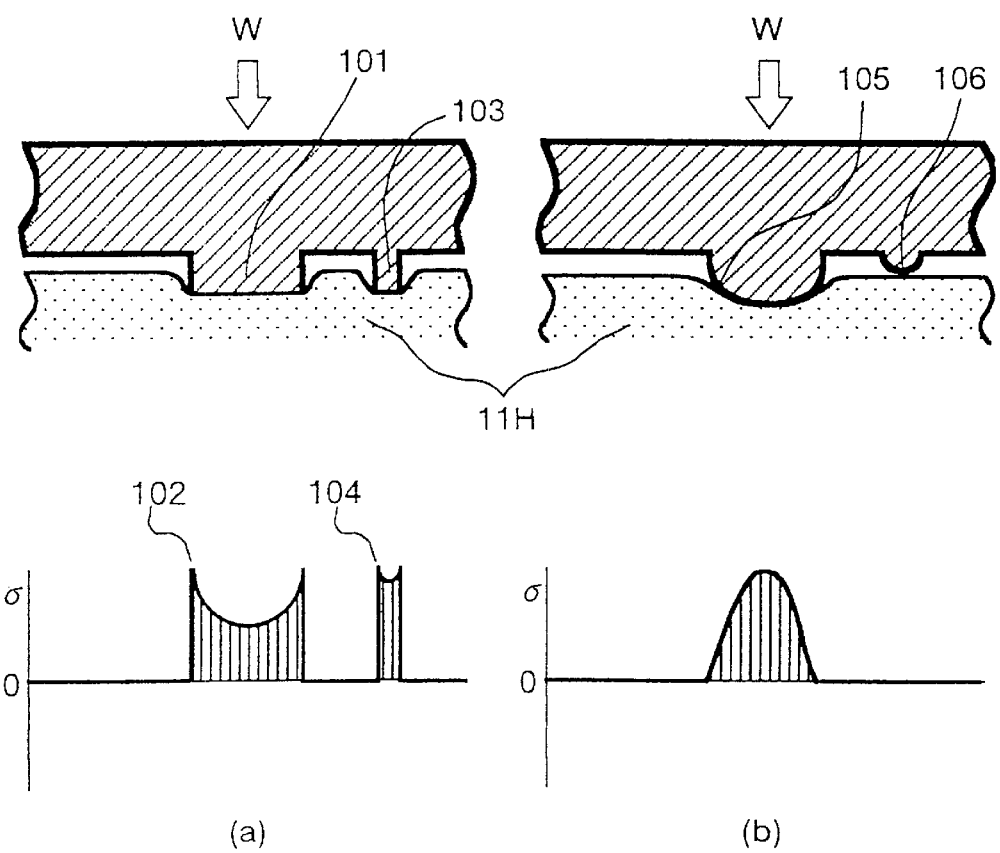

The pattern damage problem which is attributable to the above stress concentration at the initial stage of processing can be overcome by removing beforehand pattern corner portions which will cause the stress concentration, and by also removing fine patterns. More specifically, as shown in FIG. 7(*b*), the problem in question can be solved by rounding corner portions 105 of the wide pattern and by reducing the height of the fine pattern and rounding corner portions thereof, as indicated at 106. Stress distribution for such patterns is not concentrated, as shown in the lower diagram of the same figure, thus permitting application of a large polishing load even in the use of a polishing tool harder than in the prior art. As a result, it becomes possible to realize a processing of reduced pattern width dependence in a short time.

Figure 8:
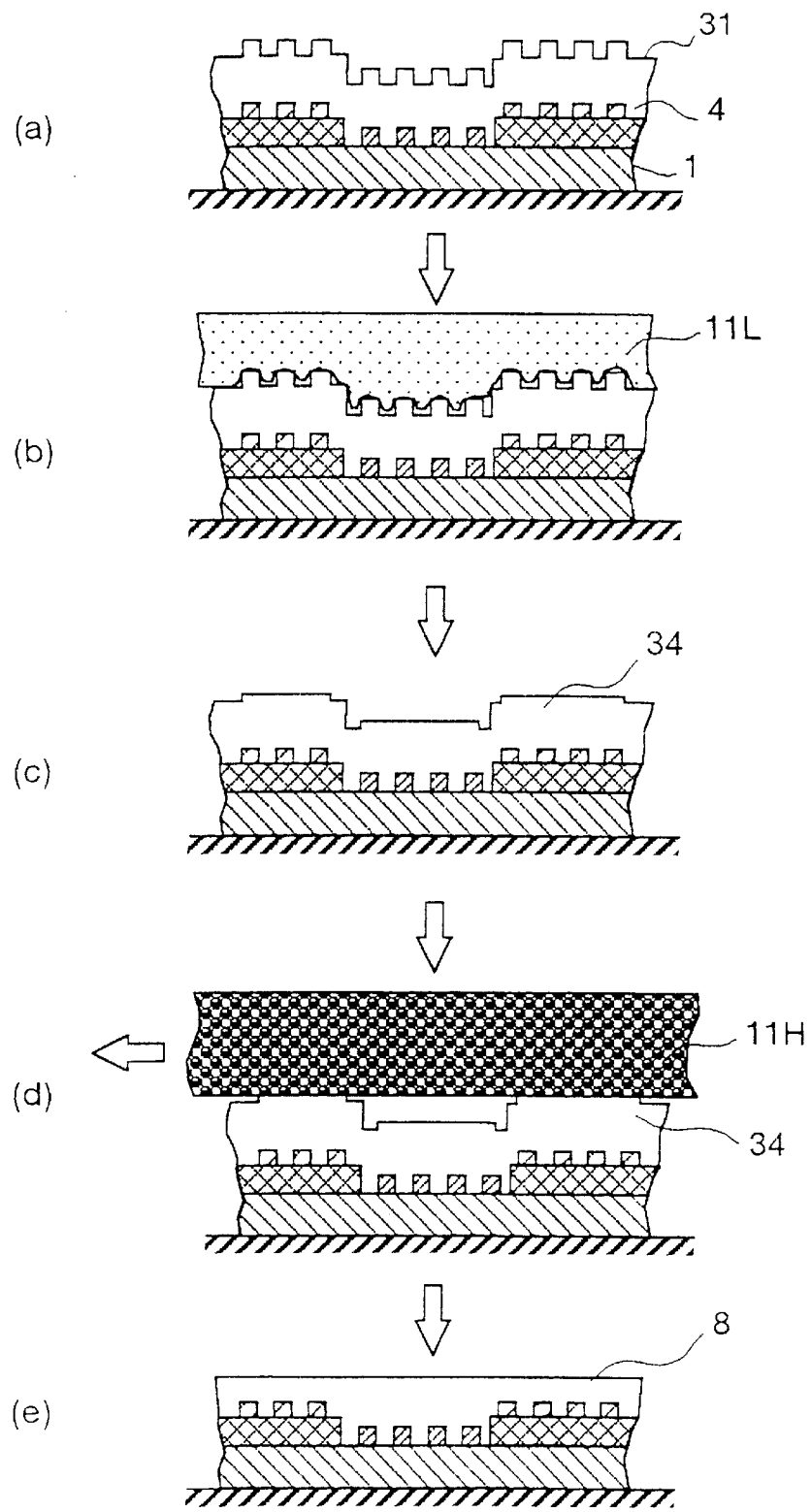
FIGS. 8(a) to 8(e) are diagrams explaining an embodiment of the present invention.

The above basic concept can be realized by going through two polishing steps. In this regard, a concrete example will now be described with reference to FIGS. 8(*a*) to 8(*e*). According to the first step (FIGS. 8(*a*) and (*b*)), a wafer surface 31 to be processed is polished for one minute or so using a soft polishing pad 11L (a pad having fine pores in the pad surface like, for example, SUPREME-RN, a product of RODEL NITTA Co.) and a polishing slurry (not shown). As the polishing slurry, there may be used any of those commonly used such as colloidal silica, cerium oxide and alumina. As shown in FIG. 8(*c*), fine pattern portions of the order of submicron, which had been present before processing, disappeared by polishing and large pattern corner portions were also rounded.

Next, as the second step, polishing is performed for 3 minutes or so using a hard polishing tool 11H that is superior in planarizing function as shown in FIG. 8(*d*), for example a grindstone of the construction shown in FIG. 5. Since fine patterns apt to be damaged have already been removed in the first step described above, even if there is used a polishing tool that is harder than that used in the first step, cracks are not developed at the base portions of fine patterns, and it is possible to carry out a damage-free planarization process, as shown in FIG. 8(*e*).

The polishing tool used in the second polishing step is not specially limited insofar as it can polish the wafer surface flatwise at a high speed. Not only the grindstone for polishing but also a quite common combination of a conventional hard polishing pad formed of polyurethane foam with colloidal silica will do. However, by using a grindstone of 5 to 500 kg/mm$^2$ in elastic modulus there can be obtained a flat, crack-free polished surface in a short time.

Thus, by first removing pattern portions (that might easily break) with a soft tool and then carrying out a planarization process with a hard tool of high rigidity, that superior in a shape creating function, there can be obtained a polished surface that is substantially free of damage. This effect was found out for the first time through concrete experiments conducted by the present inventors. The technique of obtaining a final processed surface through a plurality of polishing steps has been well known heretofore, as disclosed in, for example, Japanese Patent Laid Open Nos. Sho 1-42823 and Hei 2-267950. In all of such known methods, a polishing step that is high in processing efficiency but apt to cause damage is followed by a smoothing step intended to remove the damage generated in the polishing step. To this end, the hardness of the polishing pad used in the first step is harder than that of the pad used in the second step. In the present invention, in contrast therewith, it is intended to first remove a factor of such processing damage, and thus the technical concept of the present invention is quite different from that of the known methods.

Figure 10:
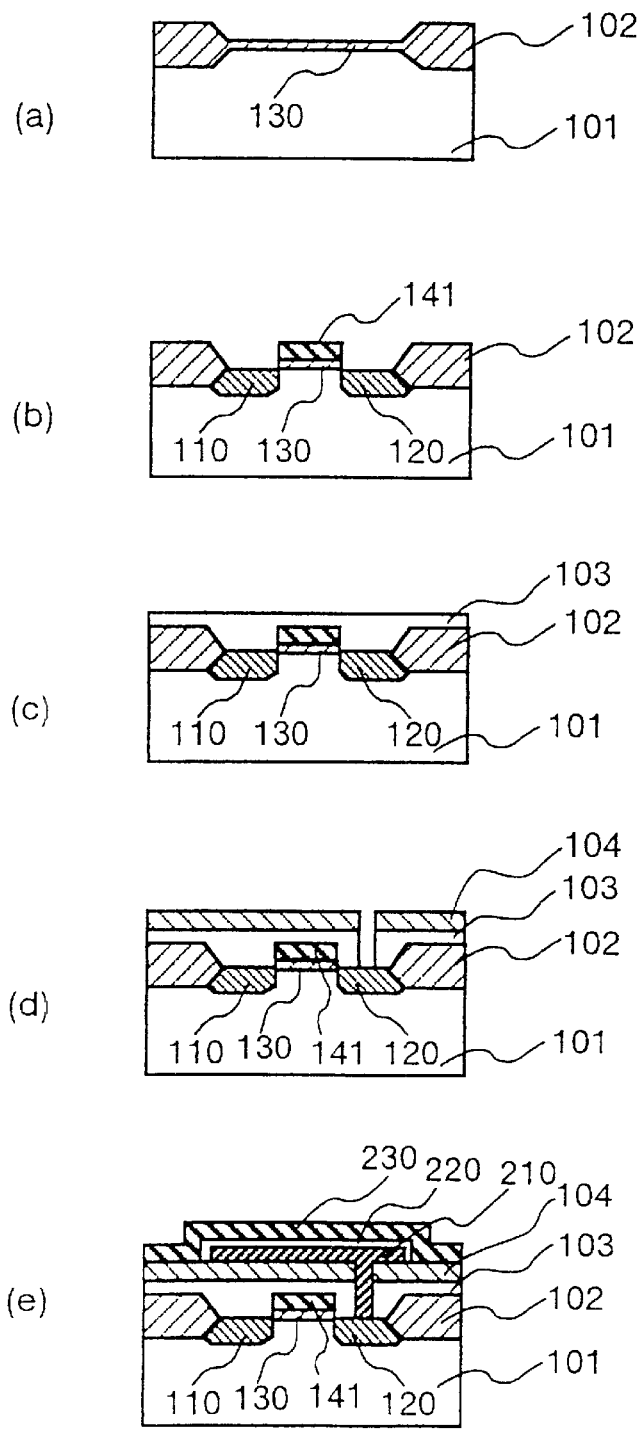
FIGS. 10(a) to 10(e) are sectional views of a semiconductor device, showing a manufacturing process for the semiconductor device.

FIGS. 10(*a*) to (*e*) show an example of a manufacturing process for a memory cell comprising one transistor and one capacitor according to the present invention. The sectional views of FIG. 10 are taken along line A–A' in FIG. 11. In these figures, the numeral 110 denotes a source region, numeral 120 denotes a drain region, numerals 111 and 121 denote connecting portions for connection to the regions 110 and 120, respectively, numeral 210 denotes a capacitor lower electrode, numeral 230 denotes a capacitor upper electrode, numeral 106 denotes a bit line, and numeral 141 denotes a gate electrode.

FIG. 10(*a*) is a sectional view of a p-type silicon substrate 101 after formation thereon, by a selective oxidation method, of an element isolation film 102 as a silicon oxide film of 800 nm thick for electrical isolation between memory cells and a silicon oxide film as a gate insulating film of a switching MOS transistor. Thereafter, boron is introduced by ion implantation to make a threshold voltage control for the MOS transistor, and further a polycrystalline silicon film serving as the gate electrode 141 is deposited to a thickness of 300 nm by a chemical vapor deposition method (hereinafter referred to simply as the CVD method). Next, as shown in FIG. 10(*b*), the gate electrode 141 and gate insulating film 130 of the MOS transistor are formed according to the known photoetching technique. Phosphorus is added to the polycrystalline silicon film to render the same film conductive electrically. Subsequently, arsenic is introduced by ion implantation to form the source region 110 and drain region 120 of the MOS transistor.

Next, as shown in FIG. 10(*c*), a PSG (phosphorus glass) film 103 serving as an interlayer insulating film is deposited on the substrate surface to a thickness of 500 nm by the CVD method, followed by polishing for planarization to about 200 nm. The elastic modulus of the grindstone used for polishing the PSG film 103 is 50 kg/mm$^2$.

Figure 11:
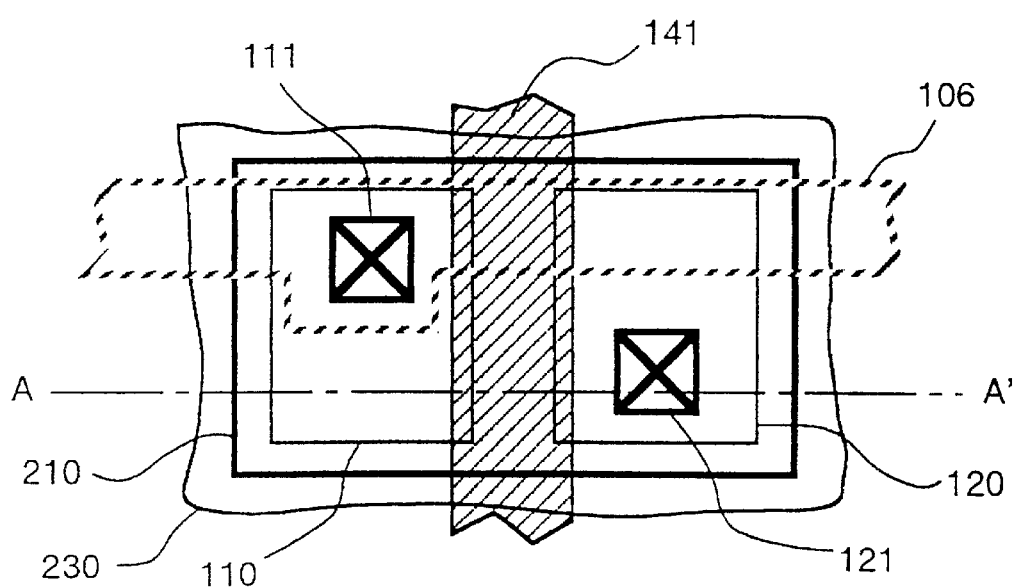
FIG. 11 is a plan view of the device shown in FIG. 10(e).

Thereafter, a connecting portion 111 is formed in the PSG film and a bit line 106 is formed (FIG. 11).

Next, as shown in FIG. 10(*d*), a PSG film 104 serving as an interlayer insulating film is deposited to a thickness of 500 nm by the CVD method, followed by polishing for planarization and subsequent opening by photoetching to form a connecting portion 121. The surface of the PSG film 104 is planarized with use of a grindstone having an elastic modulus of 50 kg/mm$^2$. If the polishing of the PSG film with the grindstone of 50 kg/mm$^2$ in elastic modulus is preceded by polishing of the same film with a conventional soft polishing pad, the polishing can be effected in a state of reduced damage.

Subsequently, a polycrystalline silicon film serving as the capacitor lower electrode 210 is formed by the CVD method and is processed into a desired shape. Also to this polycrystalline silicon film is added phosphorus to render the film conductive electrically. Next, a capacitor insulating film 220 and a capacitor electrode 230 are formed on the polycrystalline silicon film (FIG. 10(*e*))

By the above method it is possible to make the memory cell surface flatter than in the prior art, and a semiconductor device of a fine structure and a high reliability can be obtained.

Figure 9:
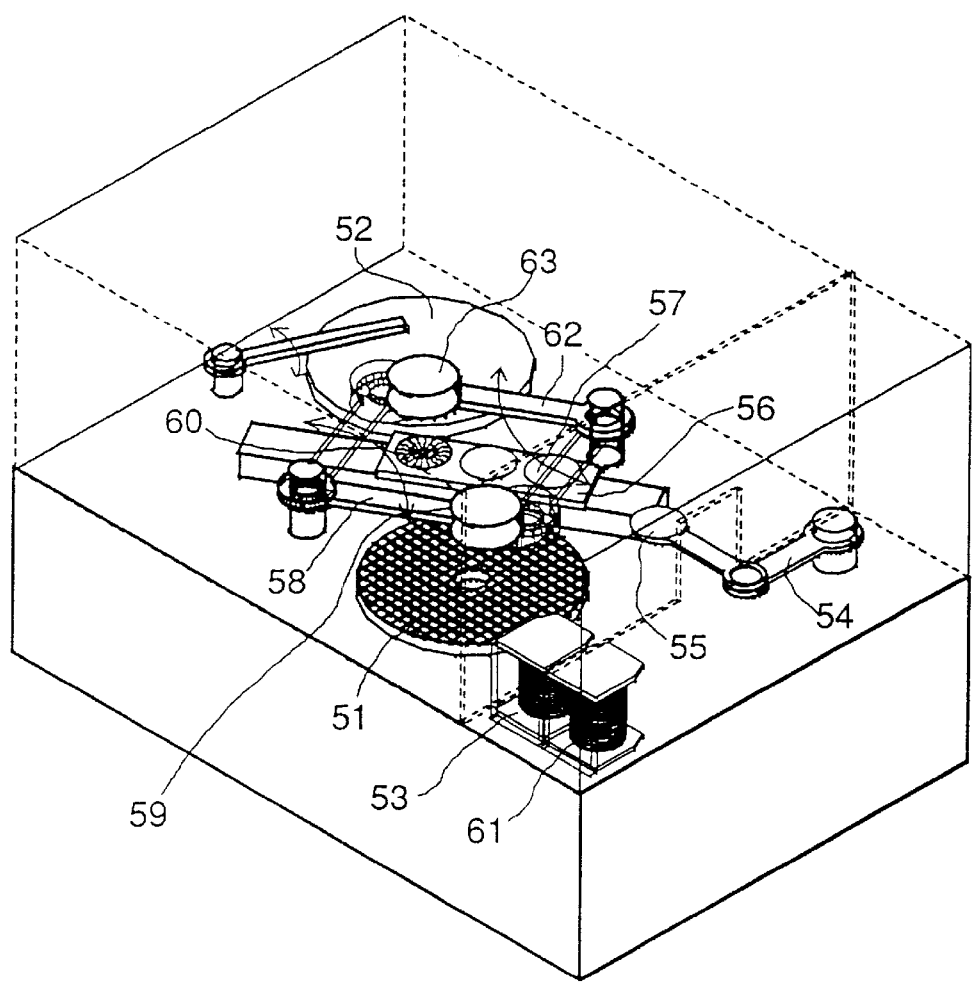
FIG. 9 is a diagram showing an example of structure of a processing apparatus suitable for practicing the. present invention.

Now, with reference to FIG. 9, a description will be given of the construction of a processing apparatus suitable for practicing the present invention. This apparatus is basically a polishing apparatus of a two-platen, two-head construction, but is characterized by polishing tools on the platens and a method for operating them. A grindstone platen 51 with the foregoing grindstone of a low elastic modulus bonded to the upper surface thereof and a polishing platen 52 with a polishing pad bonded to the upper surface thereof each rotate at a constant speed of 20 rpm or so. A wafer 55 to be processed is taken out from a loader cassette 53 by means of a handling robot 54 and is placed on a load ring 57 which is carried on a direct-acting carrier 56. Next, the direct-acting carrier 56 moves leftward in the figure and is brought into a load/unload position, whereupon a polishing arm A58 rotates and the wafer 55 is vacuum-chucked to the underside of a wafer polishing holder 59 provided at the tip of the polishing arm. Next, the polishing arm A58 rotates in such a manner that the holder 59 is positioned on the polishing pad platen 52. The holder 59 rotates holding and pushing down the wafer 55 onto the polishing pad 52, allowing the wafer to be polished for about one minute under the supply of a polishing slurry (not shown). By this polishing operation, fine pattern portions of submicron order on the wafer surface, which would cause processing damage as noted previously, disappear and corner portions of large-sized patterns are rounded.

After completion of the above first polishing step, the polishing arm A58 rotates so that, the wafer polishing holder 59 is positioned on the grindstone platen 51. Thereafter, the holder 59 rotates while holding and pushing the wafer 55 onto the grindstone platen 51, and the wafer 55 is subjected to lapping for about two minutes under the supply of a polishing slurry (not shown) in the same way as above. When this second polishing step is over, the polishing arm A58 again rotates so that the wafer polishing holder 59 becomes positioned on the polishing platen 52, and the wafer 55 is polished for about one minute in the same way as above. This polishing operation after the lapping process is for removing slight scratches or the like developed in the lapping process. Of course, the polishing process in question may be omitted depending on lapping conditions or the level of surface roughness required.

The polishing process is completed by the above three steps of polishing and the wafer then goes through a washing process. The polishing arm A58 rotates so that the wafer polishing holder 59 is located above a washing position where a rotary brush 60 is disposed. While rotating, the rotary brush 60 washes, using a rinsing brush, the processed surface of the wafer 55 chucked to the underside of the holder 59. When the washing is over, the direct-acting carrier 56 again moves up to above the aforesaid washing position and receives the wafer which is now released from the vacuum chucking by the holder 59.

Instead of the rotary brush used above, there may be adopted a washing method which uses a water jet under the action of ultrasonic waves.

Thereafter, when the direct-acting carrier 56 returns to the load/unload position, the wafer handling robot 54 chucks the processed wafer and stows it into an unloading cassette 61.

This is are one cycle of operations of the polishing arms A58. In parallel with these operations, a polishing arm B62 also operation in the same manner. As a matter of course, this is for utilizing the two polishing surface tables effectively in a time-sharing manner. The operation sequence of the polishing arm B62 is just the same as that of the polishing arm A58, provided its phase lags by only a half-cycle. That is, the polishing arm B62 starts operating in synchronism with the start of the foregoing second polishing step.

The construction of the above embodiment is suitable for the case where the number of polishing arms is two. In this construction, if there is provided a position where the rotating paths of the two polishing arms cross or contact each other and if at that position there are provided a pair of washing brushes and a stop position of the direct-acting load/unload carrier, it is possible for the two polishing arms to also fulfill the functions concerned.

Although the above embodiment uses two polishing arms, only one polishing arm may be used for the simplification of construction. Conversely, for improving the throughput of the apparatus, there may be used three or more polishing arms, or a plurality of wafer polishing holders may be attached to a single polishing arm. Further, although in the above embodiment two independent rotary surface tables are used respectively for polishing pad and grindstone, there may be used only one rotary surface table. In this case, a ring-like grindstone is provided at the peripheral portion of the rotary surface table and a polishing pad is disposed centrally of the surface table. There also may be adopted a design in which a rotary surface table is tilted to diminish the foot print (projected area for installation) of the apparatus.

INDUSTRIAL APPLICABILITY

The present invention is applicable to not only. semiconductor devices but also to liquid crystal display devices, micromachines, magnetic disk substrates, optical disk substrates, fresnel lenses, and other optical elements having fine surface structures.

What is claimed is:

1. A semiconductor device manufacturing method, comprising the steps of:
    forming an insulating film on a semiconductor body, and polishing said insulating film by using a grindstone comprising abrasive grains and a material for holding said abrasive grains, said polishing step including a step of reducing concavities and convexities of concave-convex patterns of said insulating film; and
    further comprising the step, before polishing said insulating film by using said grindstone, of polishing said insulating film by chemical mechanical polishing.

2. A semiconductor device manufacturing method according to claim 1, wherein the method is performed so that the step of polishing the insulating film by using said grindstone achieves a surface roughness for the insulating film of 2 nmRa.

3. A method of fabricating a semiconductor device according to claim 1, wherein the insulating film is silicon dioxide.

4. A method of fabricating a semiconductor device according to claim 1, wherein said step of polishing by using said grindstone polishes the insulating film over at least one active device that is in insulating contact with the insulating film during said polishing by using said grindstone.

5. A method of fabricating a semiconductor device, comprising the steps of:

preparing a semiconductor substrate and an insulating film formed on said substrate, said insulating film having a fine-width concave-convex area and a large-width concave-convex area; and polishing said insulating film by using a grindstone comprising abrasive grains and a material for holding said abrasive grains, thereby planarizing the surface of said insulating film having said concave-convex area.

6. The method according to claim 5, wherein said grindstone has a modulus of elasticity not more than 500 kg/mm$^2$.

7. The method according to claim 5, wherein said abrasive grains include at least one of silicon dioxide, cerium oxide and alumina.

8. The method according to claim 5, wherein pure water is supplied as a polishing fluid onto said grindstone during said polishing step.

9. The method according to claim 5, further comprising the step of:

forming a wiring layer on said insulating film after said polishing step.

10. A method of fabricating a semiconductor device according to claim 5, wherein said method is performed so that the step of polishing the insulating film by using said grindstone achieves a surface roughness for the insulating film of 2 nmRa.

11. A method of fabricating a semiconductor device according to claim 5, wherein the insulating film is silicon dioxide.

12. A method of fabricating a semiconductor device according to claim 5, wherein said polishing step polishes the insulating film over at least one active device that is in insulating contact with the insulating film during said polishing step.

* * * * *